US011639870B2

United States Patent
Lu et al.

(10) Patent No.: US 11,639,870 B2
(45) Date of Patent: May 2, 2023

(54) OPTICAL SENSING DEVICE

(71) Applicant: AUO Corporation, Hsinchu (TW)

(72) Inventors: Shih-Hua Lu, Hsinchu (TW); Chao-Chien Chiu, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 17/863,415

(22) Filed: Jul. 13, 2022

(65) Prior Publication Data

US 2023/0027911 A1    Jan. 26, 2023

Related U.S. Application Data

(60) Provisional application No. 63/224,977, filed on Jul. 23, 2021.

(30) Foreign Application Priority Data

Dec. 8, 2021  (TW) .................................. 110145953

(51) Int. Cl.
  *G01J 1/04* (2006.01)
  *G01J 1/42* (2006.01)
  *G06V 40/13* (2022.01)

(52) U.S. Cl.
  CPC ............ *G01J 1/0462* (2013.01); *G01J 1/0411* (2013.01); *G01J 1/0437* (2013.01); *G01J 1/42* (2013.01); *G06V 40/1318* (2022.01)

(58) Field of Classification Search
  CPC ........ G01J 1/0411; G01J 1/0437; G01J 1/0462; G01J 1/42; G06V 40/1318
  See application file for complete search history.

(56) References Cited

U.S. PATENT DOCUMENTS 10,921,626 B2    2/2021  Deng et al.
2022/0373387 A1*  11/2022  Lu .......................... G02B 5/005

FOREIGN PATENT DOCUMENTS

| CN | 106873251 | 6/2017 |
| CN | 113486801 | 10/2021 |
| CN | 113642396 | 11/2021 |
| TW | M567414 | 9/2018 |

* cited by examiner

*Primary Examiner* — Kevin K Pyo
(74) *Attorney, Agent, or Firm* — JCIPRNET (57) ABSTRACT

An optical sensing device includes a substrate, a sensing element layer, a first planarization layer, and a second planarization layer. The sensing element layer is located on the substrate and includes a plurality of sensing elements. The first planarization layer is located on the sensing element layer and has a first slit. The second planarization layer is located on the first planarization layer and has a second slit. An orthogonal projection of the first slit extending in a direction and located on the substrate is not overlapped with an orthogonal projection of the second slit extending in the same direction and located on the substrate, and the orthogonal projection of the second slit on the substrate has a curved pattern.

18 Claims, 9 Drawing Sheets

OPTICAL SENSING DEVICE

CROSS-REFERENCE TO RELATED APPLICATION

This application claims the priority benefits of U.S. provisional application Ser. No. 63/224,977, filed on Jul. 23, 2021, and Taiwanese application serial no. 110145953, filed on Dec. 8, 2021. The entirety of each of the above-mentioned patent applications is hereby incorporated by reference herein and made a part of this specification.

BACKGROUND

Technical Field

The disclosure relates to a sensing device, and in particular to an optical sensing device.

Description of Related Art

To establish a smart living environment, sensing technologies have been widely used in various electronic devices. For instance, devices such as mobile phones and electronic locks apply fingerprint sensors to scrutinize personal data security and enforce access control. In terms of practical application requirements, the fingerprint sensor need be equipped with a light collimation design, e.g., a light shielding layer is applied to limit a light receiving angle of a sensing element, and organic materials are stacked to ensure a sufficient thickness, which facilitates microlens focusing collimation of light beams for obtaining a fingerprint image of sufficient clarity.

Since the organic thick film is prone to warpage due to temperature changes during the manufacturing process, a film cutting design is currently applied to release the stress in the organic thick film and solve the warpage issue. However, owing to the pressure change by vacuum relief in the subsequent manufacturing process, the film cutting design may cause air or gas to rush into the place where the film cutting design is adopted, which leads to sealant puncture or wire breakage and thus results in poor production yield.

SUMMARY

The disclosure provides an optical sensing device with an improved production yield.

An embodiment of the disclosure provides an optical sensing device that has a sensing region and a non-sensing region surrounding the sensing region, and the optical sensing device includes a substrate, a sensing element layer, a first planarization layer, and a second planarization layer. The sensing element layer is located on the substrate and includes a plurality of sensing elements located in the sensing region. The first planarization layer is located on the sensing element layer and has a first slit. The second planarization layer is located on the first planarization layer and has a second slit. Here, an orthogonal projection of the first slit extending in a direction and located on the substrate is not overlapped with an orthogonal projection of the second slit extending in the direction and located on the substrate, and one portion of the orthogonal projection of the second slit located in the non-sensing region on the substrate has a curved pattern.

In an embodiment of the disclosure, the other portion of the orthogonal projection of the second slit located in the sensing region on the substrate has a linear pattern.

In an embodiment of the disclosure, the first planarization layer further has a first trench located in the non-sensing region, the second planarization layer further has a second trench located in the non-sensing region, and an orthogonal projection of the first trench on the substrate is overlapped with an orthogonal projection of the second trench on the substrate.

In an embodiment of the disclosure, the first slit extends along a first direction and a second direction and penetrates the first planarization layer, and the first direction and the second direction are perpendicular to each other.

In an embodiment of the disclosure, the second slit extends along a first direction and a second direction and penetrates the second planarization layer, and the first direction and the second direction are perpendicular to each other.

In an embodiment of the disclosure, the curved pattern is an S-shaped curved pattern or a zigzag pattern.

In an embodiment of the disclosure, a total area of the first slit and the second slit accounts for 0.05% to 6% of a total area of the optical sensing device.

In an embodiment of the disclosure, the optical sensing device further includes a first light shielding layer that is located on the sensing element layer and has a plurality of first openings. Here, an orthogonal projection of each of the first openings on the substrate is overlapped with an orthogonal projection of each of the sensing elements on the substrate.

In an embodiment of the disclosure, the optical sensing device further includes a second light shielding layer that is located on the first planarization layer and has a plurality of second openings. Here, an orthogonal projection of each of the second openings on the substrate is overlapped with an orthogonal projection of each of the sensing elements on the substrate.

In an embodiment of the disclosure, the optical sensing device further includes a plurality of microlens structures located on the second planarization layer, and an orthogonal projection of each of the microlens structures on the substrate is overlapped with an orthogonal projection of each of the sensing elements on the substrate.

Another embodiment of the disclosure provides an optical sensing device that has a sensing region and a non-sensing region surrounding the sensing region, and the optical sensing device includes a first substrate, a sensing element layer, a first planarization layer, and a second planarization layer. The sensing element layer is located on the first substrate and includes a plurality of sensing elements located in the sensing region. The first planarization layer is located on the sensing element layer and has a first slit located in the sensing region and a first trench located in the non-sensing region. The second planarization layer is located on the first planarization layer and has a second slit located in the sensing region and a second trench located in the non-sensing region. Here, an orthogonal projection of the first slit extending in a direction and located on the first substrate is not overlapped with an orthogonal projection of the second slit extending in the direction and located on the first substrate, and an orthogonal projection of the first trench on the first substrate is overlapped with an orthogonal projection of the second trench on the first substrate.

In an embodiment of the disclosure, the first slit further extends to the non-sensing region and is connected to the first trench.

In an embodiment of the disclosure, the second slit further extends to the non-sensing region and is connected to the second trench In an embodiment of the disclosure, the orthogonal projection of the first trench on the first substrate and the orthogonal projection of the second trench on the first substrate have a ring-shaped pattern.

In an embodiment of the disclosure, the optical sensing device further includes a third planarization layer that is located between the sensing element layer and the first planarization layer, and the third planarization layer has a third slit located in the sensing region and a third trench located in the non-sensing region. Here, the orthogonal projection of the first slit extending in the direction and located on the first substrate, the orthogonal projection of the second slit extending in the direction and located on the first substrate, and an orthogonal projection of the third slit extending in the direction and located on the first substrate are not overlapped, and an orthogonal projection of the third trench on the first substrate is overlapped with the orthogonal projection of the first trench on the first substrate and the orthogonal projection of the second trench on the first substrate.

In an embodiment of the disclosure, the optical sensing device further includes a second substrate opposite to the first substrate, and the sensing element layer, the first planarization layer, and the second planarization layer are located between the second substrate and the first substrate.

In an embodiment of the disclosure, the optical sensing device further includes a color-resist pattern that is located between the second substrate and the second planarization layer.

In an embodiment of the disclosure, the optical sensing device further includes a spacer that is located between the second substrate and the second planarization layer.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

In the accompanying drawings, the thickness of layers, films, panels, regions, and so forth are enlarged for clarity. The same reference numbers refer to the same elements throughout the specification. It should be understood that when an element, such as a layer, a film, a region, or a substrate is referred to as being "on" or "connected to" another element, it can be directly on or connected to the another element, or an intermediate element may also be present. By contrast, when an element is referred to as being "directly on" or "directly connected to" another element, no intermediate element is present. As used herein, being "connected" may refer to a physical and/or electrical connection. Furthermore, being "electrically connected" or "coupled" may refer to the presence of other elements between the two elements.

It should be understood that, although the terminologies "first," "second," "third," and so forth may serve to describe various elements, components, regions, layers, and/or sections in this disclosure, these elements, components, regions, layers, and/or sections shall not be limited by these terminologies. These terminologies merely serve to distinguish one element, component, region, layer, and/or section from another element, component, region, layer, or section. Thus, a first "element," "component," "region," "layer," or "section" discussed below may be called as a second element, component, region, layer, or section without departing from the teachings herein.

The terminologies used herein are only for the purpose of describing particular embodiments and are not restrictive. As used herein, the singular forms "a," "an," and "the" are intended to include the plural forms including "at least one" or represent "and/or" unless the content clearly indicates otherwise. As used herein, the terminology "and/or" includes any and all combinations of one or more of the associated listed items. It should also be understood that when used in this disclosure, the terminologies "include" and/or "comprise" indicate the presence of the described features, regions, overall scenarios, steps, operations, elements, and/or components but do not exclude the presence or addition of one or more other features, regions, overall scenarios, steps, operations, elements, components, and/or combinations thereof.

Furthermore, relative terminologies, such as "lower" or "bottom" and "upper" or "top" may be used herein to describe the relationship between one element and another element, as shown in the drawings. It should be understood that relative terminologies are intended to encompass different orientations of the device in addition to the orientation shown in the drawings. For instance, if a device in one of the accompanying drawings is turned upside down, elements described as being on the "lower" side of other elements would then be oriented on the "upper" sides of the other elements. Thus, the exemplary terminology "lower" may include an orientation of being on the "lower" side and the "upper" side, depending on the particular orientation of the accompanying drawings. Similarly, if the device in one of the accompanying drawings is turned upside down, elements described as being "below" or "beneath" other elements would then be oriented "above" the other elements. Thus, the exemplary terminology "below" or "beneath" may encompass an orientation of being above and below.

Considering the particular amount of measurement and measurement-related errors discussed (i.e., the limitations of the measurement system), the terminology "about," "approximately," or "substantially" used herein includes the average of the stated value and an acceptable range of deviations from the particular value as determined by those skilled in the art. For instance, the terminology "about" may refer to as being within one or more standard deviations of the stated value, or within ±30%, ±20%, ±10%, or ±5%. Furthermore, the terminology "about," "approximately," or "substantially" as used herein may be chosen from a range of acceptable deviations or standard deviations depending on the optical properties, etching properties, or other properties, rather than one standard deviation for all properties.

In the disclosure, exemplary embodiments are described with reference to schematic cross-sectional views of an ideal embodiment. Thus, variations in the shapes of the illustrations as a result of, for instance, manufacturing technologies and/or tolerances, may be expected. Accordingly, the embodiments described herein should not be construed as limitations to particular shapes of regions as shown in the drawings but should be interpreted to include shape deviations resulting from, for instance, manufacturing. For instance, regions illustrated or described as being flat may typically have rough and/or non-linear features. Additionally, acute angles shown herein may be round. Thus, the regions illustrated in the drawings are schematic in nature, and the shapes of the regions are not intended to be the precise shapes and are not intended to limit the scope of the claims.

Figure 1A:
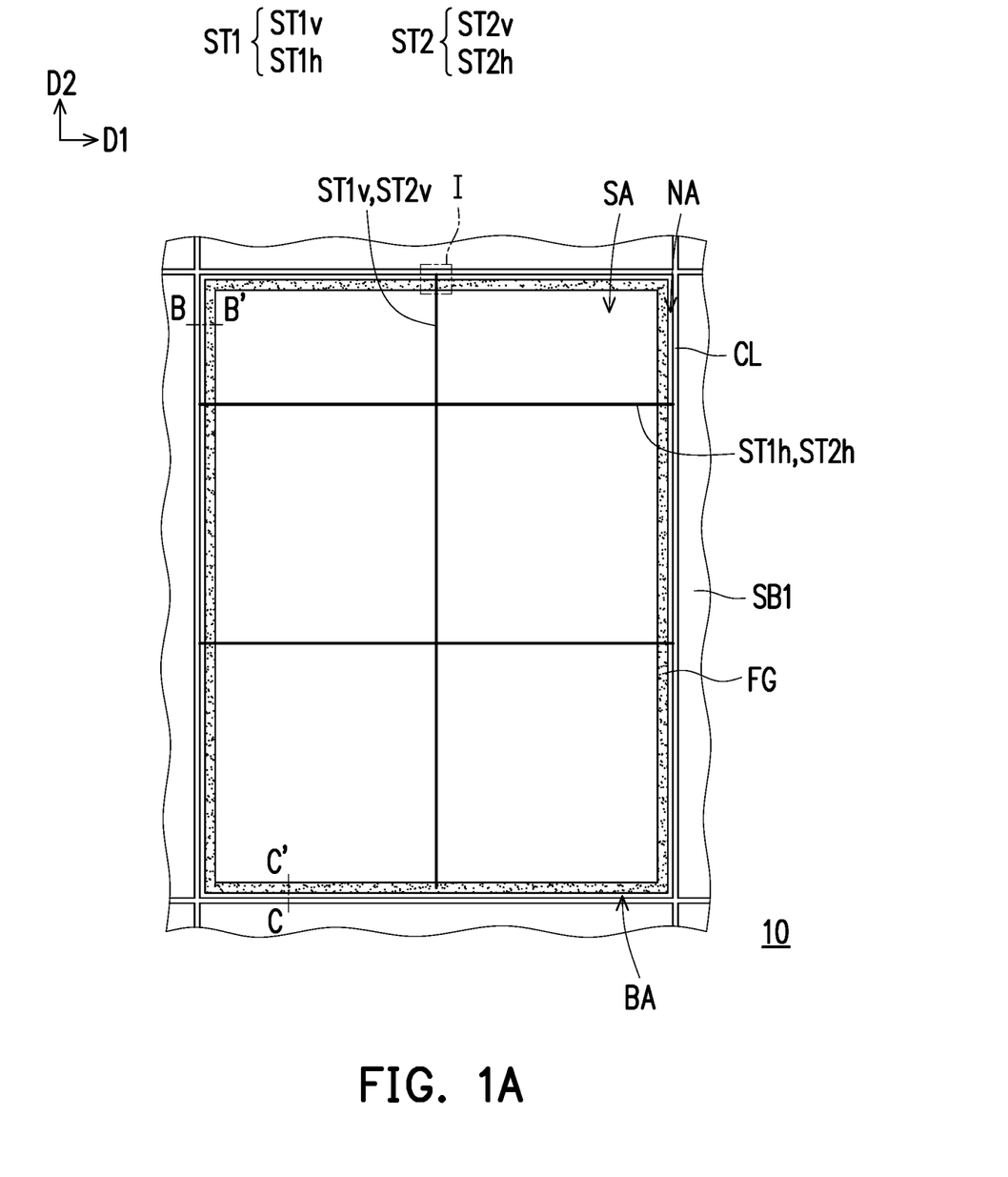
FIG. 1A is a schematic top view of an optical sensing device 10 according to an embodiment of the disclosure.
Figure 1B:
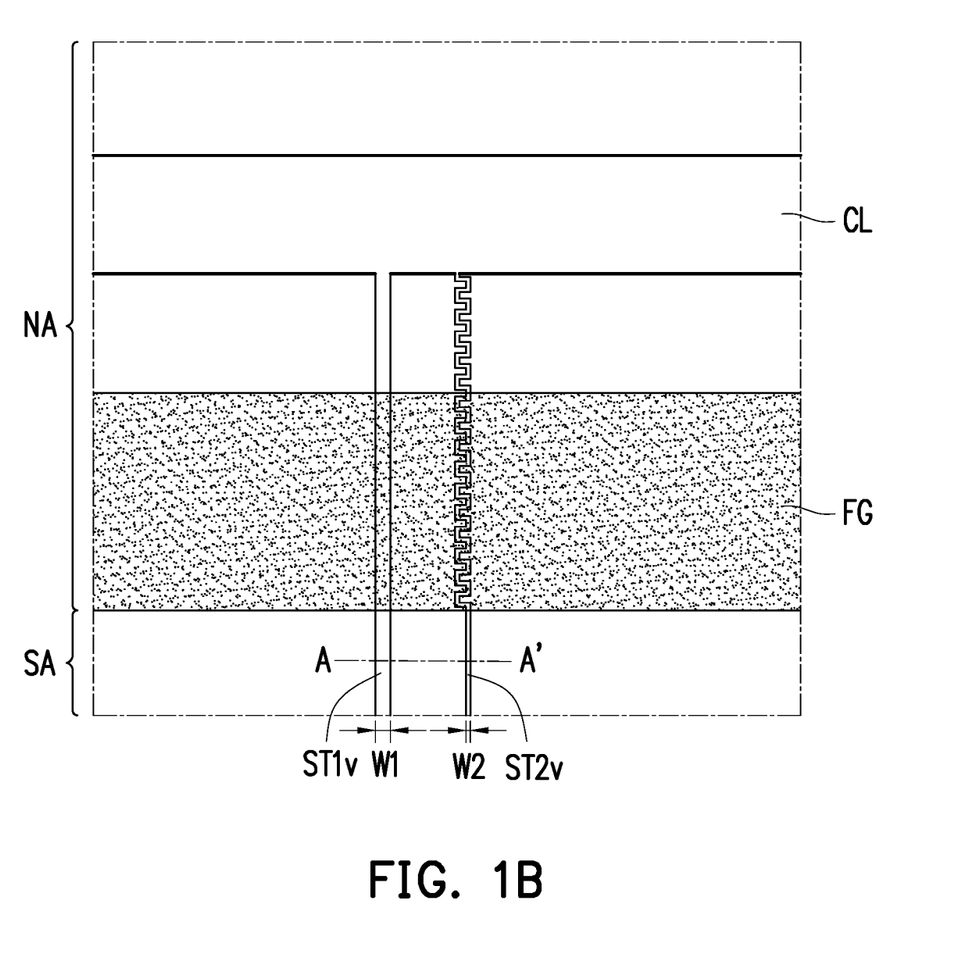
FIG. 1B is a schematic enlarged view illustrating a region I in the optical sensing device 10 depicted in FIG. 1A.
Figure 1C:
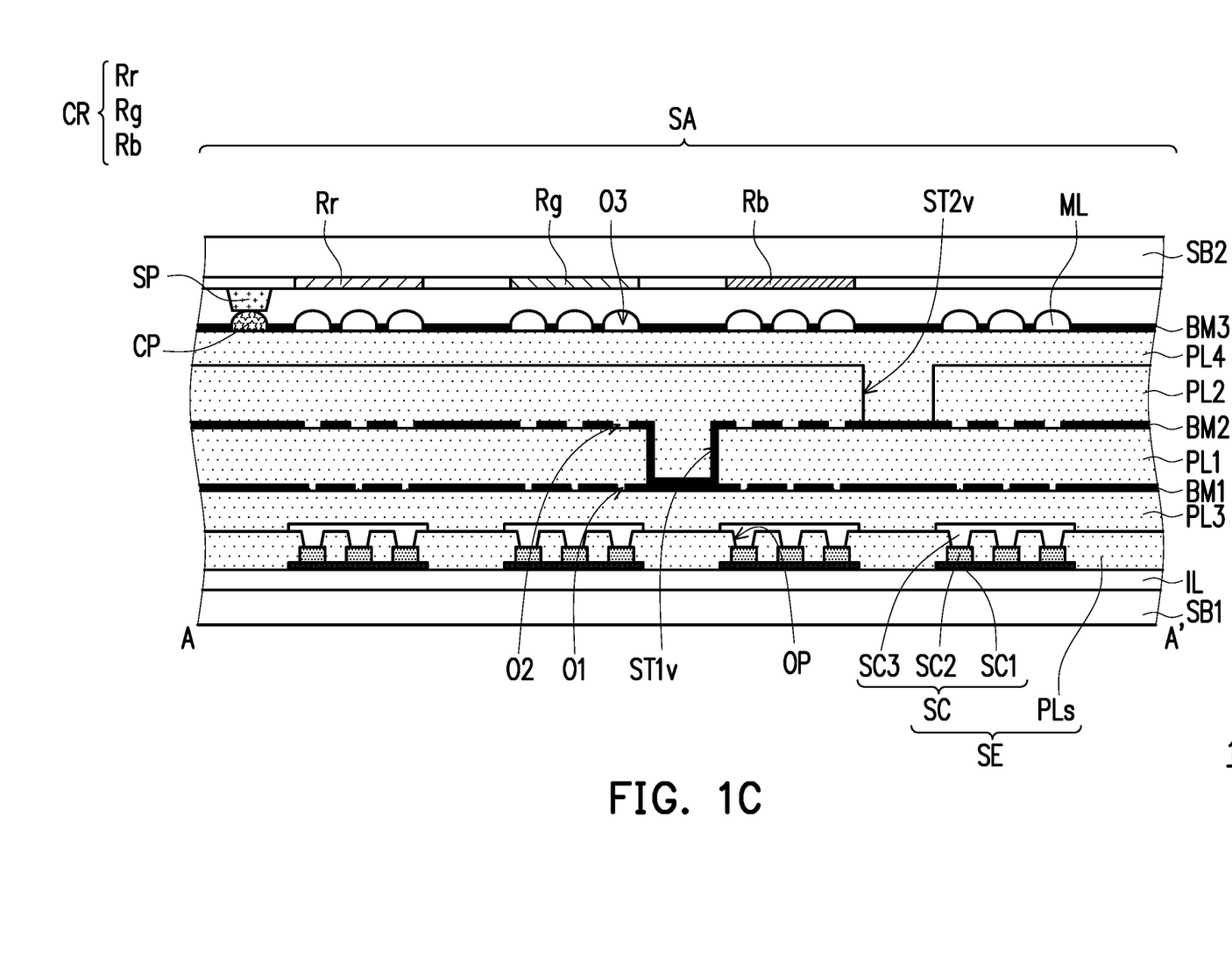
FIG. 1C is a schematic cross-sectional view taken along a sectional line A-A' depicted in FIG. 1B.
Figure 1D:
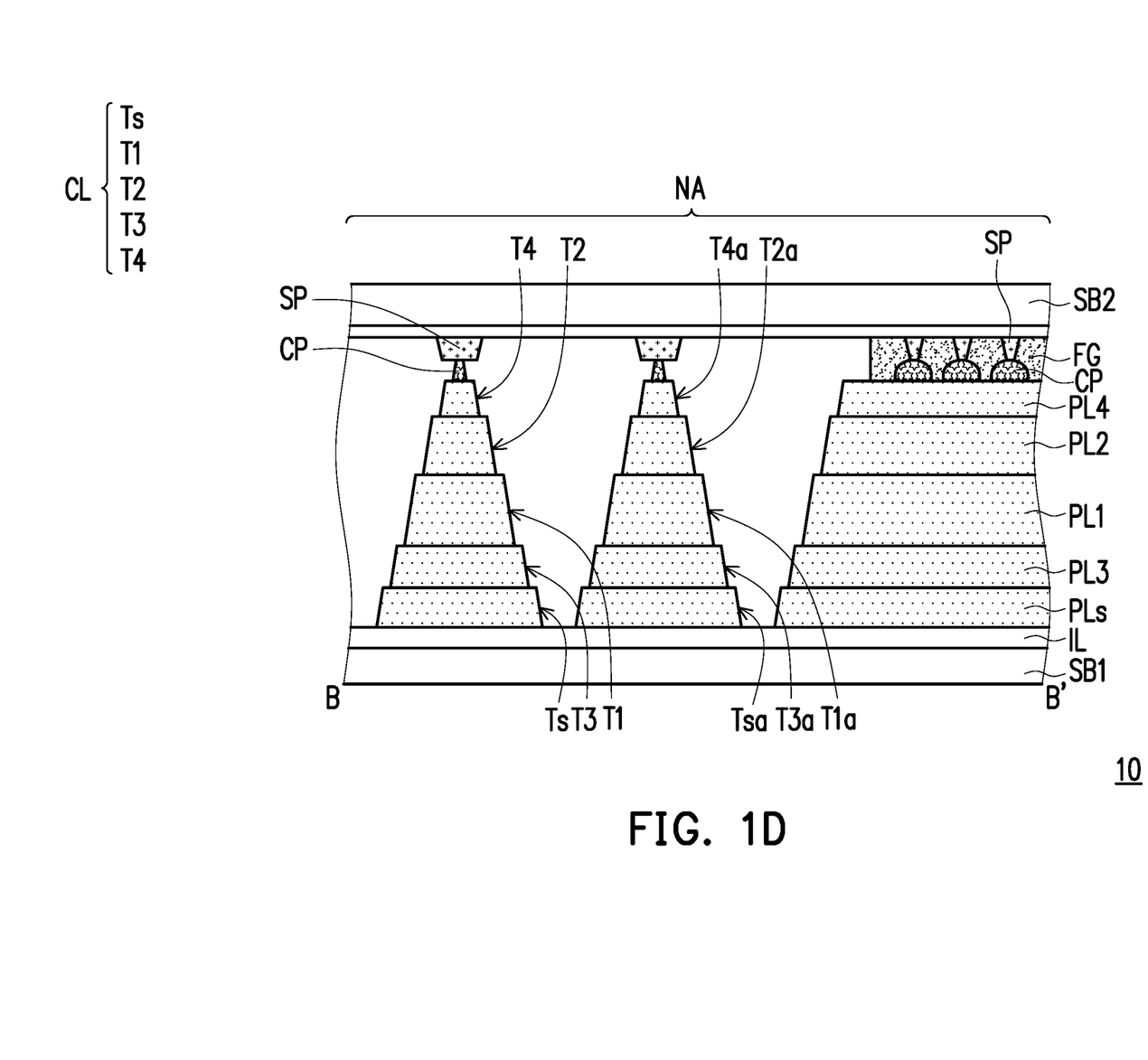
FIG. 1D is a schematic cross-sectional view taken along a sectional line B-B' depicted in FIG. 1A.
Figure 1E:
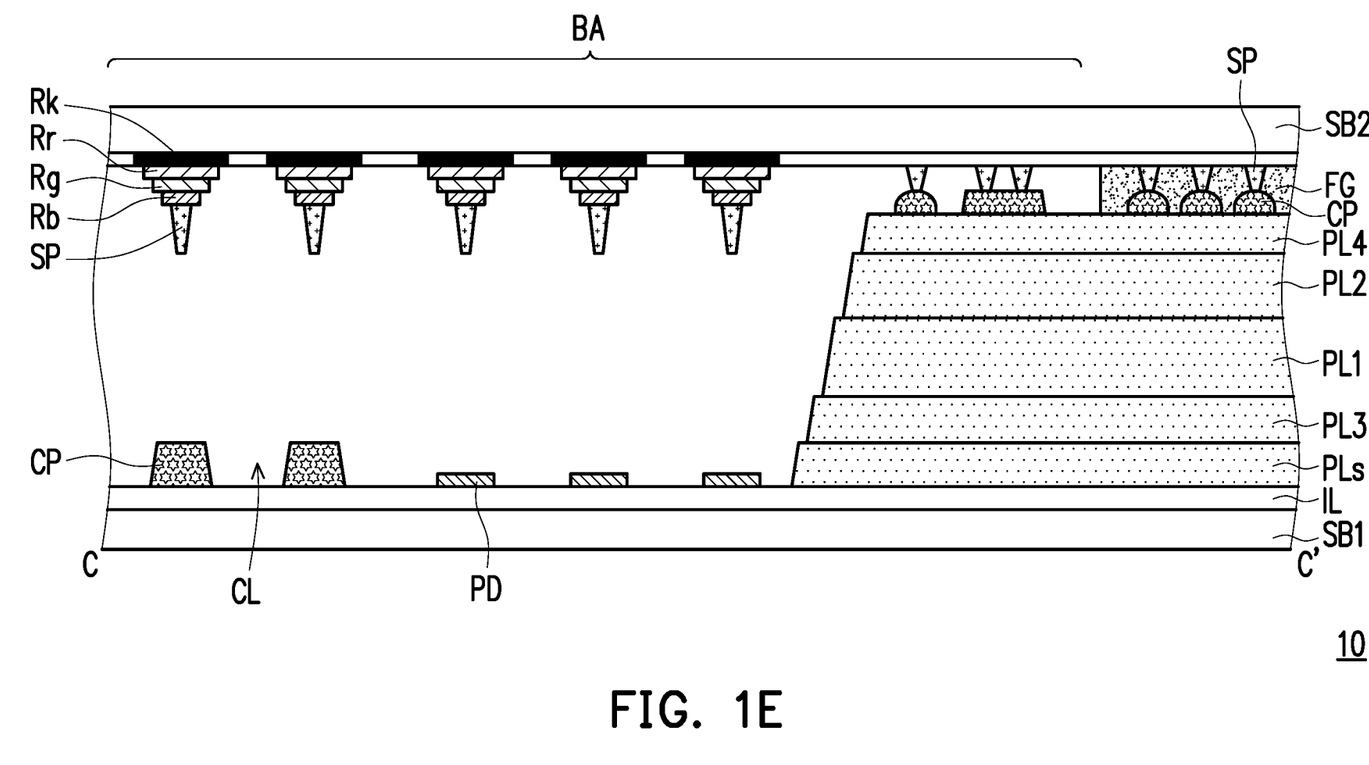
FIG. 1E is a schematic cross-sectional view taken along a sectional line C-C' depicted in FIG. 1A.

FIG. 1A is a schematic top view of an optical sensing device 10 according to an embodiment of the disclosure. FIG. 1B is a schematic enlarged view illustrating a region I in the optical sensing device 10 depicted in FIG. 1A. FIG. 1C is a schematic cross-sectional view taken along a sectional line A-A' depicted in FIG. 1B. FIG. 1D is a schematic cross-sectional view taken along a sectional line B-B' depicted in FIG. 1A. FIG. 1E is a schematic cross-sectional view taken along a sectional line C-C' depicted in FIG. 1A. To make the representation of the drawings more concise, FIG. 1A schematically illustrates a substrate SB1, a sealant FG, slits ST1 and ST2, and cutting lines CL of the optical sensing device 10 and omits other components.

First, with reference to FIG. 1A to FIG. 1C, the optical sensing device 10 includes: the substrate SB1, a sensing element layer SE, a planarization layer PL1, and a planarization layer PL2. The sensing element layer SE is located on the substrate SB1 and includes a plurality of sensing elements SC. The planarization layer PL1 is located on the sensing element layer SE and has the slit ST1. The planarization layer PL2 is located on the planarization layer PL1 and has the slit ST2. Here, an orthogonal projection of the slit ST1 and an orthogonal projection of the slit ST2 which extend along the same direction and are located on the substrate SB1 do not overlap, and the orthogonal projection of the slit ST2 on the substrate SB1 has a curved pattern.

In the optical sensing device 10 provided in an embodiment of the disclosure, since the slit ST2 in the planarization layer PL2 has the curved pattern, air or gas may be prevented from rushing into the slit ST2, so as to prevent the issue of sealant puncture or wire breakage caused by the rushed air/gas and thereby improve the production yield of the optical sensing device 10.

Hereinafter, the embodiments of various elements of the optical sensing device 10 are provided below with reference to FIG. 1A to FIG. 1E, which should however not be construed as a limitation in the disclosure.

With reference to FIG. 1A, in this embodiment, the optical sensing device 10 may be obtained by performing a cutting process along the cutting lines CL, and the cutting lines CL may be located between two adjacent optical sensing devices 10. In general, the optical sensing device 10 may have a sensing region SA and a non-sensing region NA, and the non-sensing region NA may surround the sensing region SA. In addition, the optical sensing device 10 may also be coated with the sealant FG, and the sealant FG may surround the sensing region SA. Besides, the sealant FG and peripheries of the sealant FG may be regarded as the non-sensing region NA. In some embodiments, the non-sensing region NA may also include a bonding region BA, and the bonding region BA may be located on one side of the optical sensing device 10; for instance, the bonding region BA may be located on a lower side of the optical sensing device 10, as shown in FIG. 1A, which should however not be construed as a limitation in the disclosure.

The substrate SB1 of the optical sensing device 10 may be a flexible substrate or a rigid substrate, and a material of the substrate SB1 may be ceramics, quartz, glass, polymer, or any other suitable material, which should however not be construed as a limitation in the disclosure.

With reference to FIG. 1C, in some embodiments, the optical sensing device 10 may further include an insulation layer IL, and the insulation layer IL may be disposed between the substrate SB1 and the sensing element layer SE. A material of the insulation layer IL may be silicon oxide, silicon nitride, or a stacked layer containing at least two of the above materials, which should however not be construed as a limitation in the disclosure.

In this embodiment, the sensing elements SC in the sensing element layer SE may be located in the sensing region SA, and each of the sensing elements SC may include a first electrode SC1, a photosensitive layer SC2, and a second electrode SC3. The first electrode SC1, the photosensitive layer SC2, and the second electrode SC3 are sequentially stacked on the substrate SB1 in this order, for instance. In some embodiments, an area of the second electrode SC3 is larger than an area of the photosensitive layer SC2, and contours of the first electrode SC1 and the second electrode SC3 may partially overlap. In some embodiments, the first electrode SC1 and the second electrode SC3 may include a light-transmitting conductive material or an opaque conductive material, which is determined according to the usage of the sensing device 100. For instance, the optical sensing device 10 may serve as an in-display fingerprint sensor. Therefore, external light (such as light reflected by the fingerprint) passes through the second electrode SC3 and is incident to the photosensitive layer SC2. In view of the above, the second electrode SC3 is made of the light-transmitting conductive material. The photosensitive layer SC2 is characterized by the ability to convert optical energy into electrical energy to achieve an optical sensing function. In some embodiments, a material of the photosensitive layer SC2 may include a silicon-rich material, which may be silicon-rich oxide, silicon-rich nitride, silicon-rich oxynitride, silicon-rich carbide, silicon-rich carbon oxide, hydrogenated silicon-rich oxide, hydrogenated silicon-rich nitride, hydrogenated silicon-rich carbide, any other suitable material, or a combination thereof.

In some embodiments, the sensing element layer SE may also include a planarization layer PLs. The planarization layer PLs is, for instance, located between the first electrodes SC1 and the second electrodes SC3 of the sensing elements SC. In some embodiments, the planarization layer PLs has openings OP exposing the first electrodes SC1 of the sensing elements SC, the photosensitive layers SC2 are located in the openings OP and are in contact with the first electrodes SC1, and the second electrodes SC3 may be disposed on the photosensitive layers SC2 and the planarization layer PLs and in contact with the photosensitive layers SC2.

With reference to FIG. 1A to FIG. 1C, each slit ST1 of the planarization layer PL1 may completely penetrate the planarization layer PL1, and the planarization layer PL2 may fill the slit ST1. In other words, the slit ST1 may extend from the non-sensing region NA on one side of the optical sensing device 10 through the sensing region SA and then extend to the non-sensing region NA on the opposite side, so as to divide the planarization layer PL1 into two separate blocks, which may be conducive to releasing the stress. For instance, in this embodiment, the slit ST1 of the planarization layer PL1 may include two slits ST1$h$ extending along a first direction D1 and one slit ST1$v$ extending along a second direction D2, and the first direction D1 and the second direction D2 may be perpendicular to each other, so that the planarization layer PL1 may be divided into six separate blocks. However, the extension directions and the number of the slits ST1 are not particularly limited. In some embodiments, the number of the slits ST1 may be equal to or greater than one. In some embodiments, the extension direction of the slit ST1 may be different from the first direction D1 and the second direction D2. In some embodiments, a width W1 of the slit ST1 may range from 5 μm to 10 μm.

Similarly, each slit ST2 of the planarization layer PL2 may completely penetrate the planarization layer PL2 and divide the planarization layer PL2 into two separate blocks, which is conducive to releasing the stress. For instance, in this embodiment, the slit ST2 of the planarization layer PL2 may include two slits ST2$h$ extending along the first direction D1 and one slit ST2$v$ extending along the second direction D2, and the first direction D1 and the second direction D2 may be perpendicular to each other, so that the planarization layer PL2 may be divided into six separate blocks. However, the extension directions and the number of the slits ST2 are not particularly limited. In some embodiments, the number of the slits ST2 may be equal to or greater than one. In some embodiments, the extension direction of the slit ST2 may be different from the first direction D1 and the second direction D2. In some embodiments, a width W2 of the slit ST2 may range from 5 μm to 10 μm. In some embodiments, a total area of the slits ST1 and ST2 may account for about 0.05% to 6% of a total area of the optical sensing device 10.

In this embodiment, orthogonal projections of the slits ST1$v$ and ST2$v$ extending along the second direction D2 on the substrate SB1 do not overlap. Similarly, in this embodiment, orthogonal projections of the slits ST1$h$ and ST2$h$ extending along the first direction D1 on the substrate SB1 do not overlap. Thereby, the overall planarity of the planarization layers PL1 and PL2 is not affected.

In some embodiments, the optical sensing device 10 may further include a planarization layer PL3 and a light shielding layer BM1, the planarization layer PL3 may be located between the planarization layer PL1 and the sensing element layer SE, and the light shielding layer BM1 may be located between the planarization layer PL1 and the planarization layer PL3, for instance. Specifically, the light shielding layer BM1 may have a plurality of openings O1, and an orthogonal projection of each of the openings O1 on the substrate SB1 and an orthogonal projection of each sensing element SC on the substrate SB1 may be overlapped. A material of the light shielding layer BM1 may include a light shielding material and/or a reflective material, which may be metal, alloy, nitride of the aforementioned materials, oxide of the aforementioned materials, oxynitride of the aforementioned materials, or any other suitable light shielding material and/or reflective material. In some embodiments, the material of the light shielding layer BM1 may be molybdenum, molybdenum oxide or a stacked layer thereof. The light shielding layer BM1 may effectively prevent stray light from entering the sensing elements SC, thereby improving the sensing resolution. In this embodiment, the openings O1 are disposed corresponding to the sensing elements SC, so that the sensing elements SC may convert the external light passing through the openings O1 into corresponding electrical signals. In addition, in some embodiments, a region where the light shielding layer BM1 is disposed may be configured to cover a switch element, for instance, so as to prevent light leakage of the switch element.

In some embodiments, the optical sensing device 10 may further include a light shielding layer BM2, and the light shielding layer BM2 may be located between the planarization layer PL1 and the planarization layer PL2. Specifically, the light shielding layer BM2 may have a plurality of openings O2, and an orthogonal projection of each of the openings O2 on the substrate SB1 and the orthogonal projection of each of the sensing elements SC on the substrate SB1 may be overlapped. In this embodiment, the openings O2 are disposed corresponding to the sensing elements SC, so that the sensing elements SC may convert the external light passing through the openings O2 into corresponding electrical signals. A material of the light shielding layer BM2 may include a light shielding material and/or a reflective material, which may be metal, alloy, nitride of the aforementioned materials, oxide of the aforementioned materials, oxynitride of the aforementioned materials, or any other suitable light shielding material and/or reflective material. In some embodiments, the material of the light shielding layer BM2 may be molybdenum, molybdenum oxide, or a stacked layer thereof. In addition, the light shielding layer BM2 may also be disposed in the slit ST1, so as to cover the external light (such as oblique light) at a large angle and prevent light leakage. For instance, when the optical sensing device 10 serves as an in-display fingerprint sensor, stray light interference caused by the oblique light to the sensing elements SC may be prevented, thereby improving a signal-to-noise ratio of light to obtain a fingerprint image of an improved clarity. In addition, distortion of the sensed image may also be prevented.

In some embodiments, the optical sensing device 10 may further include a planarization layer PL4, the planarization layer PL4 may be located on the planarization layer PL2, and the planarization layer PL4 may fill the slit ST2 of the planarization layer PL2. In some embodiments, the planarization layers PLs, PL1, PL2, PL3, and PL4 may include, for instance, a stacked layer of an organic material layer and an inorganic material layer. Here, the organic material layer may include, for instance, polyimide (PI), polyester, benzocyclobutene (BCB), polymethylmethacrylate (PMMA), poly(4-vinylphenol) (PVP), polyvinyl alcohol (PVA), polytetrafluoroethene (PTFE), hexamethyldisiloxane (HMDSO), or a stacked layer containing at least two of the above materials, which should however not be construed as a limitation in the disclosure. The inorganic material layer may include, for instance, silicon oxide, silicon nitride, oxynitride, or a stacked layer containing at least two of the above materials, which should however not be construed as a limitation in the disclosure.

In some embodiments, the optical sensing device 10 may further include a light shielding layer BM3, the light shielding layer BM3 may be located on the planarization layer PL4, and the light shielding layer BM3 may have openings O3. A material of the light shielding layer BM3 may include a light shielding material and/or a reflective material, which may be metal, alloy, nitride of the aforementioned materials, oxide of the aforementioned materials, oxynitride of the aforementioned materials, or any other suitable light shielding material and/or reflective material. In some embodiments, the material of the light shielding layer BM3 may be molybdenum, molybdenum oxide, or a stacked layer thereof.

In some embodiments, the optical sensing device 10 may further include a plurality of microlens structures ML, and the microlens structures ML may be located in the openings O3 of the light shielding layer BM3 and disposed corresponding to the sensing elements SC. For instance, the microlens structures ML may be arranged in an array. In some embodiments, a central axis of each microlens structure ML may be overlapped a central axis of the corresponding opening O1 and a central axis of the corresponding opening O2 to further enhance the effect of light collimation. In some embodiments, the microlens structures ML may be symmetric biconvex lenses, asymmetric biconvex lenses, plano-convex lenses, or concave-convex lenses, which should however not be construed as a limitation in the disclosure.

In some embodiments, the optical sensing device 10 may further include a plurality of bumps CP, the bumps CP and the microlens structures ML may belong to the same film layer, but the bumps CP may not overlap the sensing elements SC. Besides, the bumps CP may have various shapes or dimensions, e.g., may be shaped as semicircles shown in FIG. 1C or shaped as isosceles trapezoids shown in FIG. 1D, which should however not be construed as a limitation in the disclosure.

In some embodiments, the optical sensing device 10 may further include a substrate SB2, and color-resist patterns CR may be disposed on the substrate SB2. The color-resist patterns CR may be disposed corresponding to some of the sensing elements SC to provide an anti-counterfeiting function. For instance, the color-resist patterns CR may include a red color-resist pattern Rr, a green color-resist pattern Rg, and a blue color-resist pattern Rb, and the red color-resist pattern Rr, the green color-resist pattern Rg, and the blue color-resist pattern Rb may be disposed corresponding to different sensing elements SC, respectively. Thereby, the sensing elements SC corresponding to the different color-resist patterns CR may sense optical sensing signals of different wavebands, so as to distinguish the authenticity of the sensed object.

In addition, the substrates SB1 and SB2 may be paired under high vacuum, and after the pairing process is completed, the substrate SB2 and the substrate SB1 are opposite to each other, such that the sensing element layer SE, the planarization layers PL1 and PL2, and the color-resist patterns CR may be located between the substrates SB1 and SB2, the microlens structures ML may be located between the substrate SB2 and the planarization layer PL2, and the color-resist patterns CR may be located between the microlens structures ML and the substrate SB2. In some embodiments, spacers SP may be further arranged on the substrate SB2. The spacers SP do not overlap the sensing elements SC, and the spacers SP and the bumps CP on the substrate SB1 may lean against each other, so that the substrates SB1 and SB2 may be apart from each other by a constant distance after the pairing process is completed, the microlens structures ML may be protected from being damaged due to pressure thereon, and the sensing resolution of the optical sensing device 10 may be enhanced. In addition, the spacers SP may have various shapes or dimensions; for instance, the spacers SP may be shaped as inverted trapezoids of different dimensions as shown in FIG. 1D, which should however not be construed as a limitation in the disclosure.

With reference to FIG. 1B, in this embodiment, one portion of the orthogonal projection of the slit ST2 located in the non-sensing region NA (e.g., at least the portion overlapping the sealant FG) on substrate SB1 may have an S-shaped curved pattern. Accordingly, when the substrates SB1 and SB2 release the vacuum after the pairing process is completed, the air/gas rushing into the slit ST2 may be resisted, thereby preventing sealant puncture or wire breakage resulting from the air/gas rush. In this embodiment, the other portion of the orthogonal projection of the slit ST2 located in the sensing region SA on the substrate SB1 may have a linear pattern, which should however not be construed as a limitation in the disclosure. In some embodiments, the other portion of the orthogonal projection of the slit ST2 located in the sensing region SA may also have an S-shaped curved pattern.

With reference to FIG. 1A and FIG. 1D, in this embodiment, the planarization layer PL1 may further have a trench T1 located in the non-sensing region NA, and an orthogonal projection of the trench T1 on the substrate SB1 may have a ring-shaped pattern. In other words, the trench T1 may surround the optical sensing device 10. In addition, the planarization layer PL2 may also have a trench T2 located in the non-sensing region NA, an orthogonal projection of the trench T2 on the substrate SB1 may have a ring-shaped pattern, and the orthogonal projection of the trench T1 on the substrate SB1 may completely overlap the orthogonal projection of the trench T2 on the substrate SB1. That is, the trench may also surround the optical sensing device 10. Besides, the slit ST1 may be connected to the trench T1, and the slit ST2 may be connected to the trench T2.

In other embodiments, the planarization layers PLs, PL3, and PL4 may also have trenches Ts, T3, and T4, respectively; an orthogonal projection of the trench T3 on the substrate SB1 completely overlaps the orthogonal projection of the trench T1 on the substrate SB1, an orthogonal projection of the trench Ts on the substrate SB1 completely overlaps the orthogonal projection of the trench T3 on the substrate SB1, and the orthogonal projection of the trench T2 on the substrate SB1 completely overlaps an orthogonal projection of the trench T4 on the substrate SB1, so that the trenches Ts, T1, T2, T3, and T4 may form the cutting lines CL shown in FIG. 1A. Accordingly, when a cutting process is performed on the cutting lines CL, the planarization layers PLs, PL1, PL2, PL3, and PL4 on both sides of the trenches Ts, T1, T2, T3, and T4 may, together with the corresponding spacers SP and bumps CP, constitute a structure with good supportability and stability, which is conducive to performing the cutting process and thereby improving the quality of the cutting process.

In some embodiments, the planarization layers PLs, PL1, PL2, PL3, and PL4 may further have trenches Tsa, T1a, T2a, T3a, and T4a located in the non-sensing region NA, respectively. Here, orthogonal projections of the trenches Tsa, T1a, T2a, T3a, and T4a on the substrate SB1 may be respectively located between the orthogonal projections of the trenches Ts, T1, T2, T3, and T4 on the substrate SB1 and the orthogonal projection of the sealant FG on the substrate SB1, and the orthogonal projections of the trenches Tsa, T1a, T2a, T3a, and T4a on the substrate SB1 may be overlapped, so that the planarization layers PLs, PL1, PL2, PL3, and PL4 on both sides of the cutting lines CL may be disconnected from the planarization layers PLs, PL1, PL2, PL3, and PL4 located in the sensing region SA. Accordingly, film layers in the sensing region SA may be prevented from being affected when the cutting process is performed on the cutting lines CL.

In some embodiments, as shown in FIG. 1D, a plurality of groups of the spacers SP and the bumps CPs (e.g., three groups as shown in the figure) may be arranged at a region coated with the sealant FG, so as to ensure that a stable adhesion structure between the substrate SB1 and the substrate SB2 may be formed.

With reference to FIG. 1E, in this embodiment, a plurality of bonding pads PD may be arranged at the bonding region BA of the optical sensing device 10, and the bonding pads PD may be electrically connected to an external driving element, for instance, so to transmit driving signals to the sensing elements SC. In addition, the bumps CP may be arranged on both sides of the cutting lines CL and on the substrate SB1, and black color-resist patterns Rk, the red color-resist patterns Rr, the green color-resist patterns Rg, the blue color-resist patterns Rb, and the spacers SP that are stacked may be disposed on regions of the substrate SB2 corresponding to the bonding pads PD and the bumps CP, respectively, so as to provide auxiliary supportability when the cutting process is performed on the cutting lines CL.

Other embodiments provided in the disclosure will be described below with reference to FIG. 2A to FIG. 2D, and the reference numbers and related contents provided in the embodiments shown in FIG. 1A to FIG. 1E are applied hereinafter. Here, the same reference numbers serve to represent the same or similar elements, and the description of the same technical content is omitted. For the description of the omitted part, reference may be made to the embodiments shown in FIG. 1A to FIG. 1E, and the omitted part will not be repetitively described below.

Figure 2A:
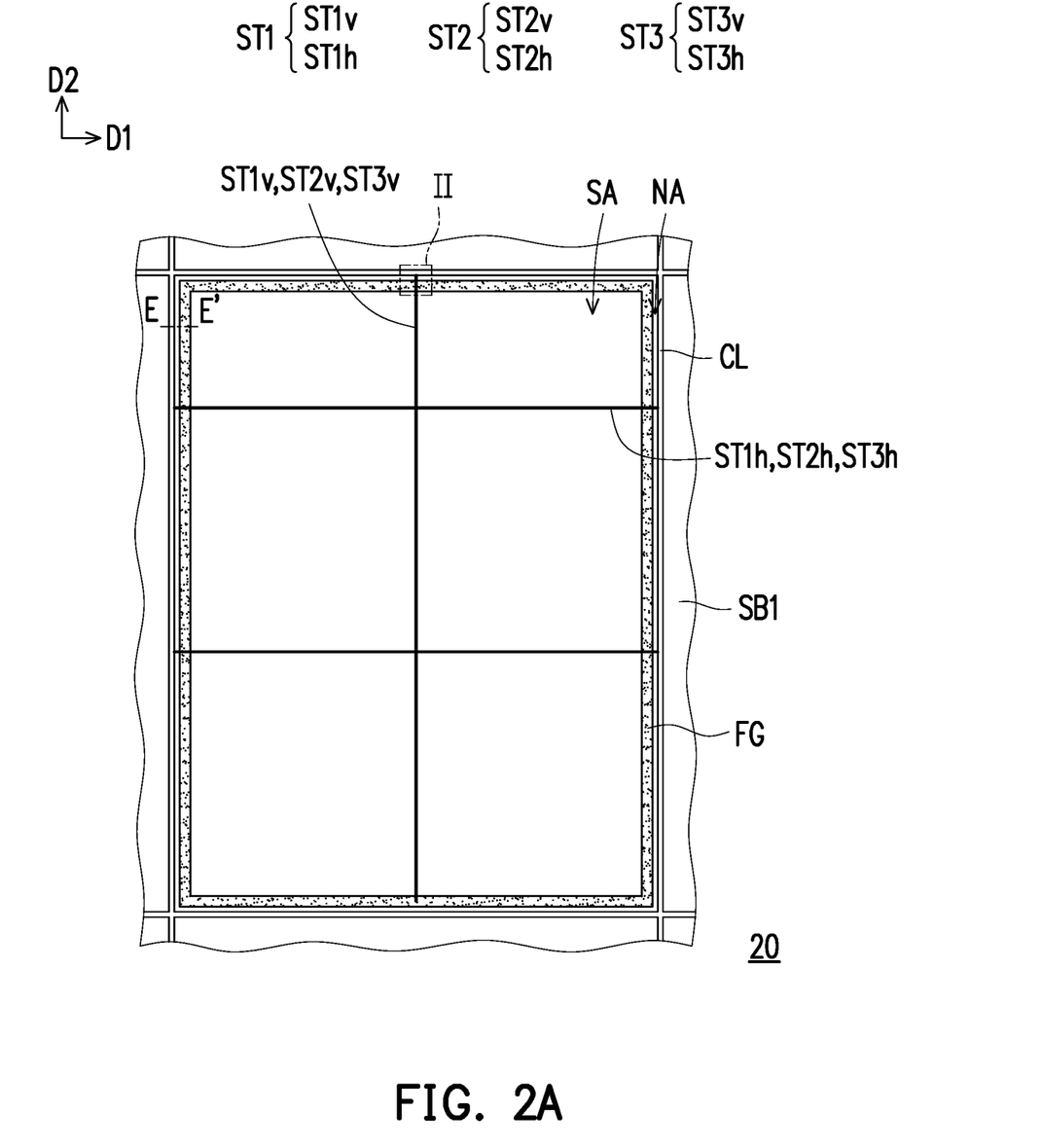
FIG. 2A is a schematic top view of an optical sensing device 20 according to an embodiment of the disclosure.
Figure 2B:
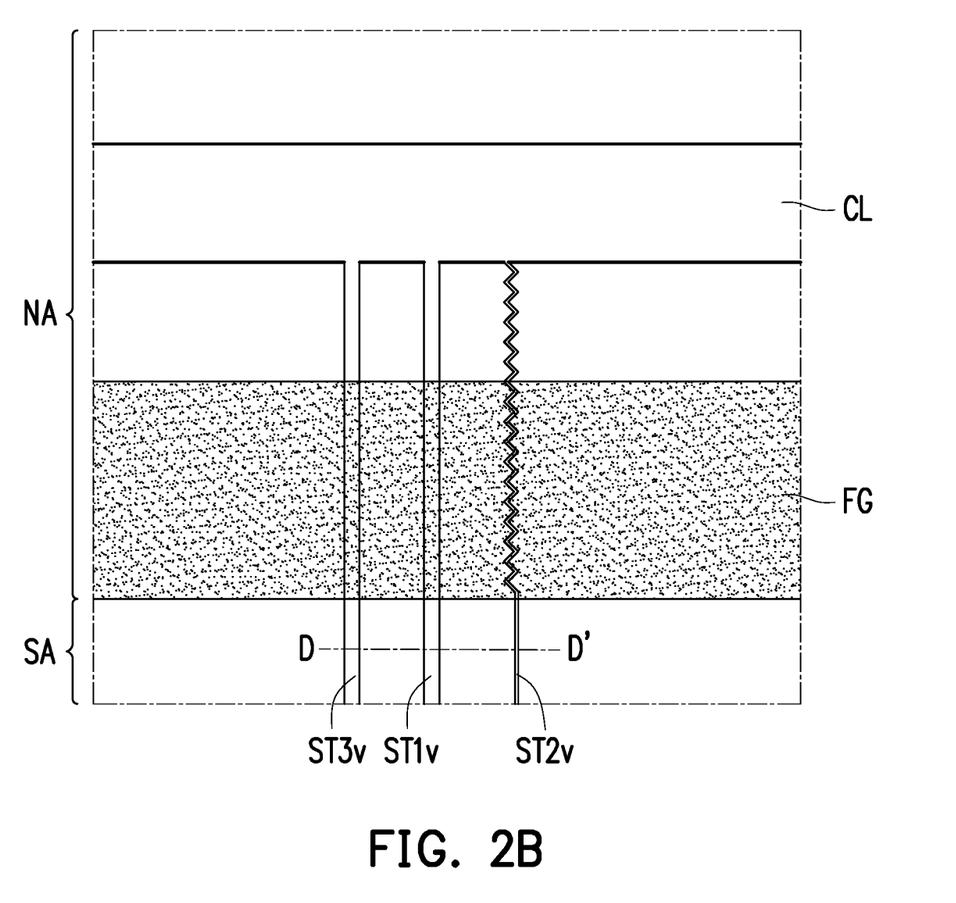
FIG. 2B is a schematic enlarged view illustrating a region II in the optical sensing device 20 depicted in FIG. 2A.
Figure 2C:
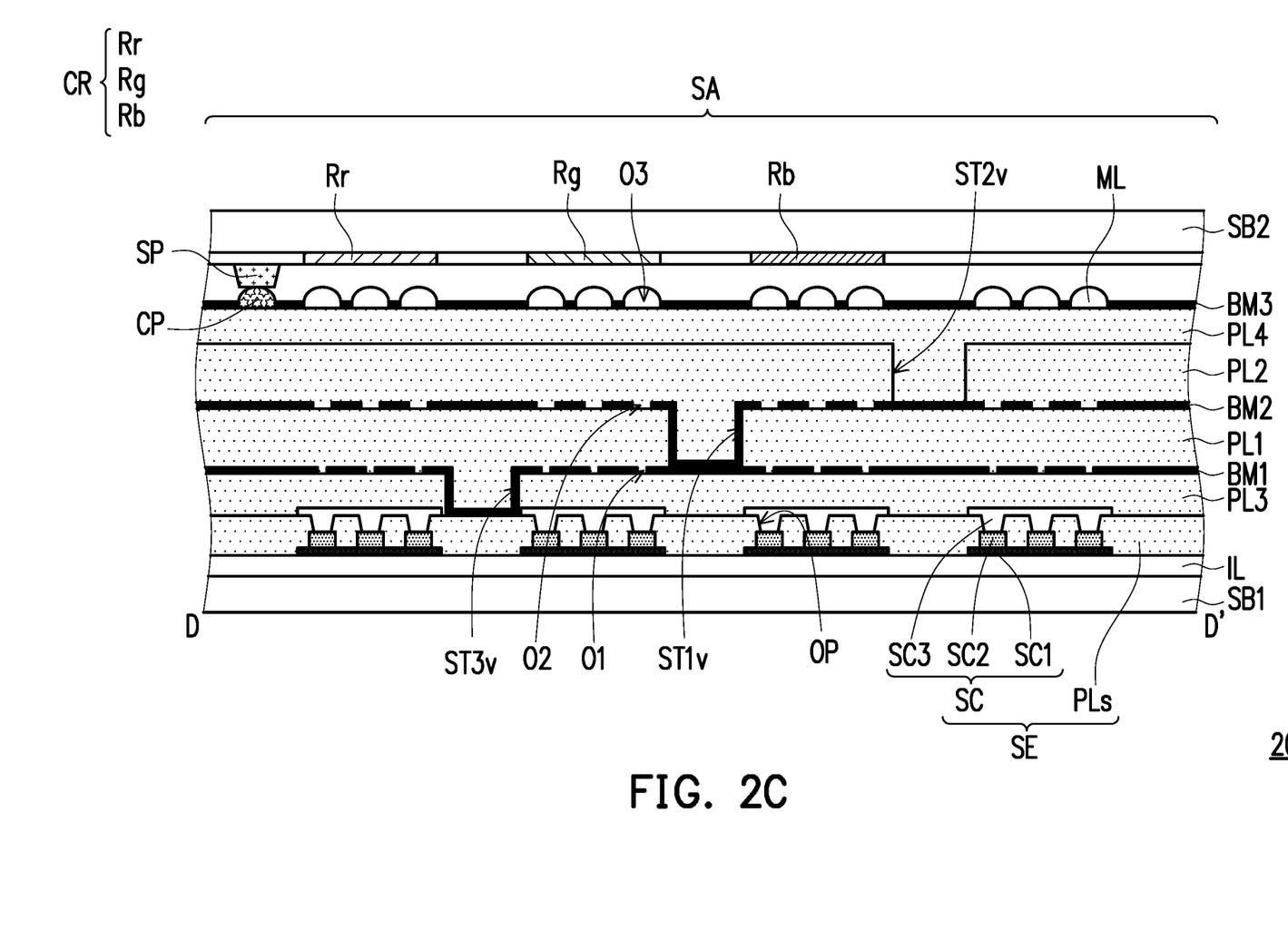
FIG. 2C is a schematic cross-sectional view taken along a sectional line D-D' depicted in FIG. 2B.
Figure 2D:
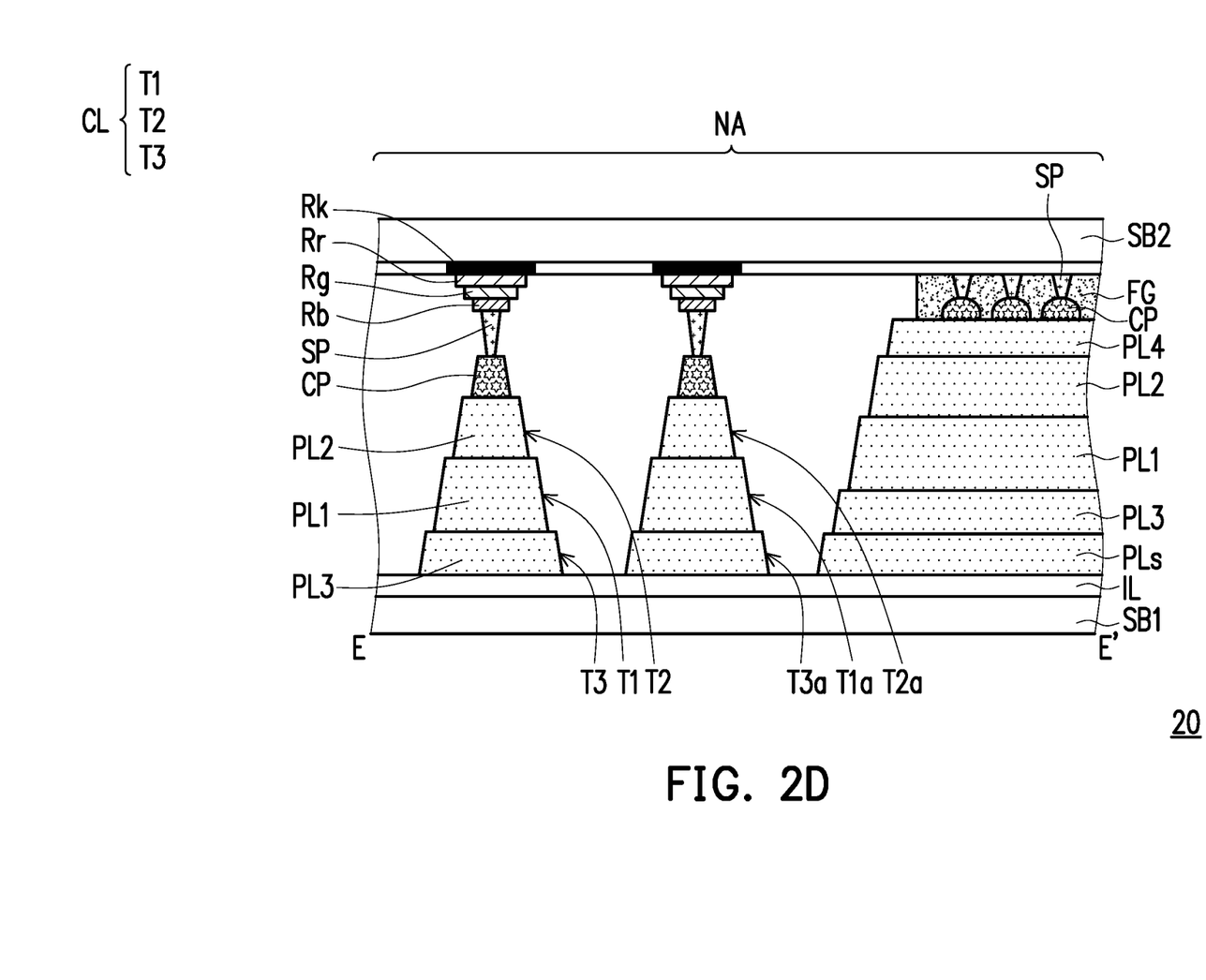
FIG. 2D is a schematic cross-sectional view taken along a sectional line E-E' depicted in FIG. 2A.

FIG. 2A is a schematic top view of an optical sensing device 20 according to an embodiment of the disclosure. FIG. 2B is a schematic enlarged view illustrating a region II in the optical sensing device 20 depicted in FIG. 2A. FIG. 2C is a schematic cross-sectional view taken along a sectional line D-D' depicted in FIG. 2B. FIG. 2D is a schematic cross-sectional view taken along a sectional line E-E' depicted in FIG. 2A. To make the representation of the drawings more concise, FIG. 2A schematically illustrates a substrate SB1, a sealant FG, slits ST1, ST2, and ST3, and a cutting line CL of the optical sensing device 20 and omits other components.

With reference to FIG. 2A to FIG. 2D, the optical sensing device 20 has the sensing region SA and the non-sensing region NA surrounding the sensing region SA, and the optical sensing device 20 includes the substrate SB1, the sensing element layer SE, the planarization layer PL1, and the planarization layer PL2. The sensing element layer SE is located on the substrate SB1 and includes a plurality of sensing elements SC located in the sensing region SA. The planarization layer PL1 is located on the sensing element layer SE and has the slit ST1 located in the sensing region SA and the trench T1 located in the non-sensing region NA. The planarization layer PL2, located on the planarization layer PL1 and has the slit ST2 located in the sensing region SA and the trench T2 located in the non-sensing region NA. Here, the orthogonal projections of the slit ST1 and the slit ST2 extending in the same direction on the substrate SB1 are not overlapped with each other, and the orthogonal projection of the trench T1 on the substrate SB1 overlaps the orthogonal projection of the trench T2 on the substrate SB1. In addition, the optical sensing device 20 may further include the planarization layers PLs, PL3, and PL4, the light shielding layers BM1, BM2, and BM3, the insulation layer IL, the microlens structures ML, the color-resist patterns CR, and the substrate SB2.

The difference between the optical sensing device 10 shown in FIG. 1A to FIG. 1E and the optical sensing device 20 shown in FIG. 2A to FIG. 2D lies in that the planarization layer PL3 of the optical sensing device 20 further has a slit ST3, and a portion of the slit ST2 of the planarization layer PL2 located in the non-sensing region NA may have a zigzag pattern.

In this embodiment, each slit ST3 of the planarization layer PL3 may completely penetrate the planarization layer PL3, which is conducive to releasing the stress. In other words, the slit ST3 may extend from the non-sensing region NA on one side of the optical sensing device 20 through the sensing region SA and then extend to the non-sensing region NA on the opposite side, so as to divide the planarization layer PL3 into two separate blocks; besides, the light shielding layer BM1 and the planarization layer PL1 may fill the slit ST3. For instance, in this embodiment, the slit ST3 of the planarization layer PL3 may include two slits ST3h extending along the first direction D1 and one slit ST3v extending along the second direction D2, and the first direction D1 and the second direction D2 may be perpendicular to each other, so that the planarization layer PL3 may be divided into six separate blocks. However, the extension directions and the number of the slits ST3 are not particularly limited. In some embodiments, the number of the slits ST3 may be equal to or greater than one. In some embodiments, the extension direction of the slit ST3 may be different from the first direction D1 and the second direction D2.

In addition, in this embodiment, at least a portion of the slit ST2 overlapping the sealant FG has a zigzag pattern. Accordingly, when the substrates SB1 and SB2 release the vacuum after the pairing process is completed, the air/gas rushing into the slit ST2 may be resisted, thereby preventing sealant puncture or wire breakage resulting from the air/gas rush. In some embodiments, the portion of the slit ST2 located in the sensing region SA may also have a zigzag pattern.

With reference to FIG. 2A and FIG. 2D, in this embodiment, the planarization layer PL3 may further have the trench T3 located in the non-sensing region NA, and the orthogonal projection of the trench T3 on the substrate SB1 may overlap the orthogonal projections of the trench T1 and the trench T2 on the substrate SB1. In other words, the trench T3 may surround the optical sensing device 10, and the orthogonal projection of the trench T3 on the substrate SB1 may have a ring-shaped pattern. Alternatively, the slit ST3 may be connected to the trench T3.

In this embodiment, the planarization layers PLs and PL4 are not arranged on both sides of the cutting lines CL, and the trenches T1, T2, and T3 may constitute the cutting lines CL shown in FIG. 2A. In some embodiments, the planarization layers PL1, PL2, and PL3 may also have trenches T1a, T2a, and T3a located in the non-sensing region NA, respectively. Here, the orthogonal projections of the trenches T1a, T2a, and T3a on the substrate SB1 may be located between the orthogonal projections of the trenches T1, T2, and T3 on the substrate SB1 and the orthogonal projection of the sealant FG on the substrate SB1, respectively, and the orthogonal projections of the trenches T1a, T2a, and T3a on the substrate SB1 may Ark be overlapped, so that the planarization layers PL1, PL2, and PL3 on both sides of the cutting lines CL may be disconnected from the planarization layers PL1, PL2, and PL3 located in the sensing region SA. Accordingly, film layers in the sensing region SA may be prevented from being affected when the cutting process is performed on the cutting lines CL. In addition, the bumps CP may be arranged on the planarization layer PL2 on both sides of the trench T2, and the black color-resist patterns Rk, the red color-resist patterns Rr, the green color-resist patterns Rg, the blue color-resist patterns Rb, and the spacers SP that are stacked may be disposed on regions of the substrate SB2 corresponding to the bumps CP, respectively. Accordingly, when the cutting process is performed on the cutting lines CL, the planarization layers PL1, PL2, and PL3 on both sides of the cutting lines CL and the bumps CP may, together with the corresponding black color-resist patterns Rk, the corresponding red color-resist patterns Rr, the corresponding green color-resist patterns Rg, the corresponding blue color-resist patterns Rb, and the corresponding spacers SP that are stacked, constitute a structure with good supportability and stability, which is conducive to performing the cutting process and thereby improving the quality of the cutting process.

To sum up, owing to the design of the curved patterns of the slits of the planarization layers, the optical sensing device provided in one or more embodiments of the disclosure may prevent the issue of sealant puncture or wire breakage caused by air/gas rush, thereby improving the production yield of the optical sensing device. In addition, the overlapping trenches of the planarization layers allow the formation of the cutting lines in the optical sensing device provided in one or more embodiments of the disclosure, which may provide the cut structure with good supportability and further improve the quality of the cutting process.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An optical sensing device, having a sensing region and a non-sensing region surrounding the sensing region and comprising:
   a substrate;
   a sensing element layer, located on the substrate and comprising a plurality of sensing elements located in the sensing region;
   a first planarization layer, located on the sensing element layer and having a first slit; and
   a second planarization layer, located on the first planarization layer and having a second slit,
   wherein an orthogonal projection of the first slit extending in a direction and located on the substrate is not overlapped with an orthogonal projection of the second slit extending in the direction and located on the substrate, and one portion of the orthogonal projection of the second slit located in the non-sensing region on the substrate has a curved pattern.

2. The optical sensing device according to claim 1, wherein the other portion of the orthogonal projection of the second slit located in the sensing region on the substrate has a linear pattern.

3. The optical sensing device according to claim 1, wherein the first planarization layer further has a first trench located in the non-sensing region, the second planarization layer further has a second trench located in the non-sensing region, and an orthogonal projection of the first trench on the substrate is overlapped with an orthogonal projection of the second trench on the substrate.

4. The optical sensing device according to claim 1, wherein the first slit extends along a first direction and a second direction and penetrates the first planarization layer, and the first direction and the second direction are perpendicular to each other.

5. The optical sensing device according to claim 1, wherein the second slit extends along a first direction and a second direction and penetrates the second planarization layer, and the first direction and the second direction are perpendicular to each other.

6. The optical sensing device according to claim 1, wherein the curved pattern is an S-shaped curved pattern or a zigzag pattern.

7. The optical sensing device according to claim 1, wherein a total area of the first slit and the second slit accounts for 0.05% to 6% of a total area of the optical sensing device.

8. The optical sensing device according to claim 1, further comprising a first light shielding layer located on the sensing element layer and having a plurality of first openings, wherein an orthogonal projection of each of the first openings on the substrate is overlapped with an orthogonal projection of each of the sensing elements on the substrate.

9. The optical sensing device according to claim 1, further comprising a second light shielding layer located on the first planarization layer and having a plurality of second openings, wherein an orthogonal projection of each of the second openings on the substrate is overlapped with an orthogonal projection of each of the sensing elements on the substrate.

10. The optical sensing device according to claim 1, further comprising a plurality of microlens structures located on the second planarization layer, wherein an orthogonal projection of each of the microlens structures on the substrate is overlapped with an orthogonal projection of each of the sensing elements on the substrate.

11. An optical sensing device, having a sensing region and a non-sensing region surrounding the sensing region and comprising:
    a first substrate;
    a sensing element layer, located on the first substrate and comprising a plurality of sensing elements located in the sensing region;
    a first planarization layer, located on the sensing element layer and having a first slit located in the sensing region and a first trench located in the non-sensing region; and
    a second planarization layer, located on the first planarization layer and having a second slit located in the sensing region and a second trench located in the non-sensing region,
    wherein an orthogonal projection of the first slit extending in a direction and located on the first substrate is not overlapped with an orthogonal projection of the second slit extending in the direction and located on the first substrate, and an orthogonal projection of the first trench on the first substrate is overlapped with an orthogonal projection of the second trench on the first substrate.

12. The optical sensing device according to claim 11, wherein the first slit further extends to the non-sensing region and is connected to the first trench.

13. The optical sensing device according to claim 11, wherein the second slit further extends to the non-sensing region and is connected to the second trench.

14. The optical sensing device according to claim 11, wherein the orthogonal projection of the first trench on the first substrate and the orthogonal projection of the second trench on the first substrate have a ring-shaped pattern.

15. The optical sensing device according to claim 11, further comprising a third planarization layer located between the sensing element layer and the first planarization layer, the third planarization layer having a third slit located in the sensing region and a third trench located in the non-sensing region, wherein the orthogonal projection of the first slit extending in the direction and located on the first substrate, the orthogonal projection of the second slit extending in the direction and located on the first substrate, and an orthogonal projection of the third slit extending in the direction and located on the first substrate are not overlapped, and an orthogonal projection of the third trench on the first substrate is overlapped with the orthogonal projection of the first trench on the first substrate and the orthogonal projection of the second trench on the first substrate.

16. The optical sensing device according to claim 11, further comprising a second substrate opposite to the first substrate, wherein the sensing element layer, the first planarization layer, and the second planarization layer are located between the second substrate and the first substrate.

17. The optical sensing device according to claim 16, further comprising a color-resist pattern located between the second substrate and the second planarization layer.

18. The optical sensing device according to claim 16, further comprising a spacer located between the second substrate and the second planarization layer.

* * * * *